(12) United States Patent
Yoshizawa et al.

(10) Patent No.: US 6,916,582 B2
(45) Date of Patent: Jul. 12, 2005

(54) MASK FOR FABRICATION OF SEMICONDUCTOR DEVICES, PROCESS FOR PRODUCTION OF THE SAME, AND PROCESS FOR FABRICATION OF SEMICONDUCTOR DEVICES

(75) Inventors: Masaki Yoshizawa, Kanagawa (JP); Shigeru Moriya, Kanagawa (JP); Kumiko Oguni, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/143,797

(22) Filed: May 14, 2002

(65) Prior Publication Data

US 2003/0010749 A1 Jan. 16, 2003

(30) Foreign Application Priority Data

May 16, 2001 (JP) ..................................... P2001-146689
Jan. 9, 2002 (JP) ..................................... P2002-002705

(51) Int. Cl.$^7$ ............................. G03F 9/00; G03C 5/00
(52) U.S. Cl. ........................................... 430/5; 430/296
(58) Field of Search .............................. 430/5, 30, 296, 430/942; 216/12

(56) References Cited

U.S. PATENT DOCUMENTS

| 4,256,532 A | * | 3/1981 | Magdo et al. ................. 216/12 |
| 5,362,575 A | * | 11/1994 | Trimble .......................... 430/5 |
| 5,728,492 A | * | 3/1998 | Kawata .......................... 430/5 |
| 6,319,636 B1 | * | 11/2001 | Ham ............................. 430/5 |

FOREIGN PATENT DOCUMENTS

JP            11-054409 A       2/1999

* cited by examiner

*Primary Examiner*—S. Rosasco
(74) *Attorney, Agent, or Firm*—Rader, Fishman & Grauer, PLLC; Ronald P. Kananen

(57) ABSTRACT

A mask for fabrication of semiconductor devices in which the membrane layer keeps high strength and is free of stress and distortion even though it is made thin. The mask has a membrane-supporting layer at the peripheral part of the mask pattern or the mask pattern region in the membrane layer constituting the mask.

12 Claims, 12 Drawing Sheets

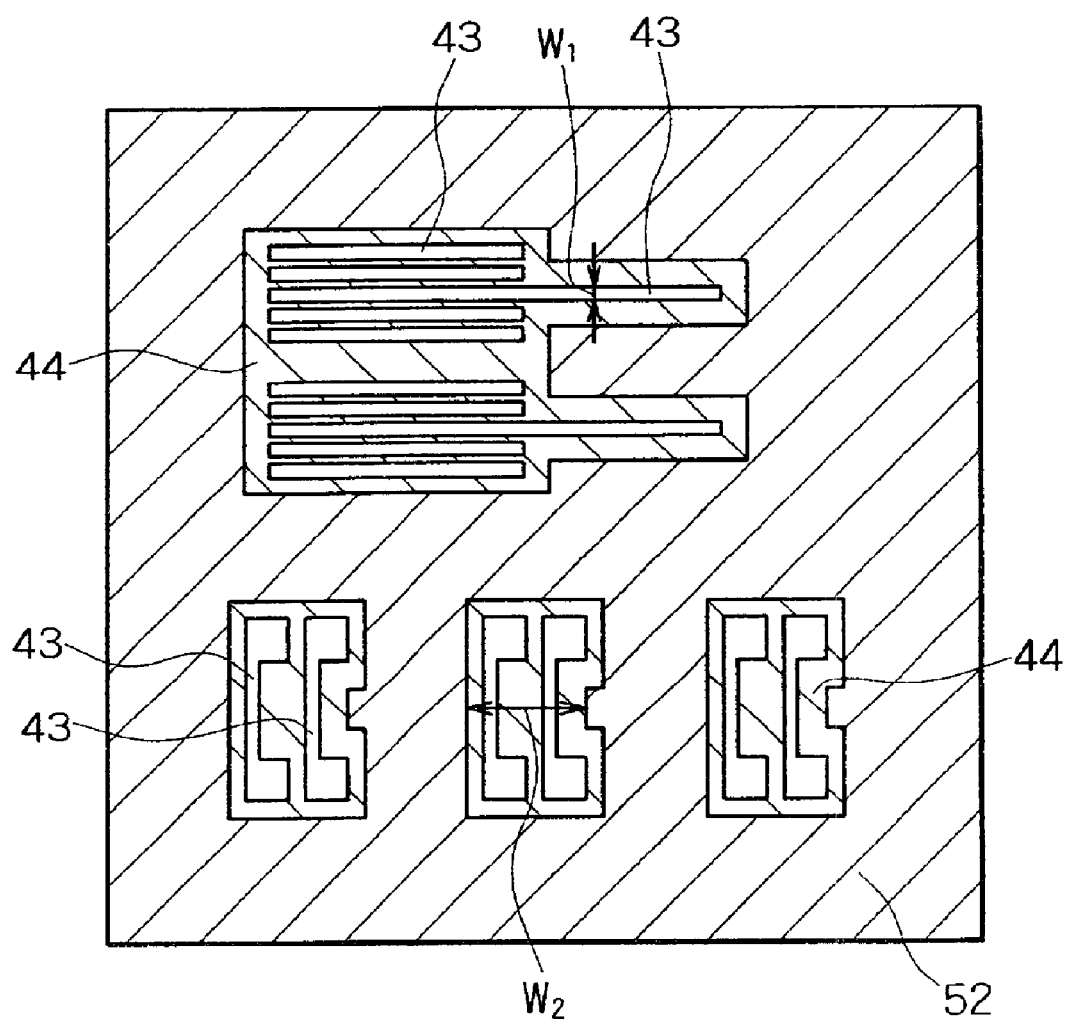

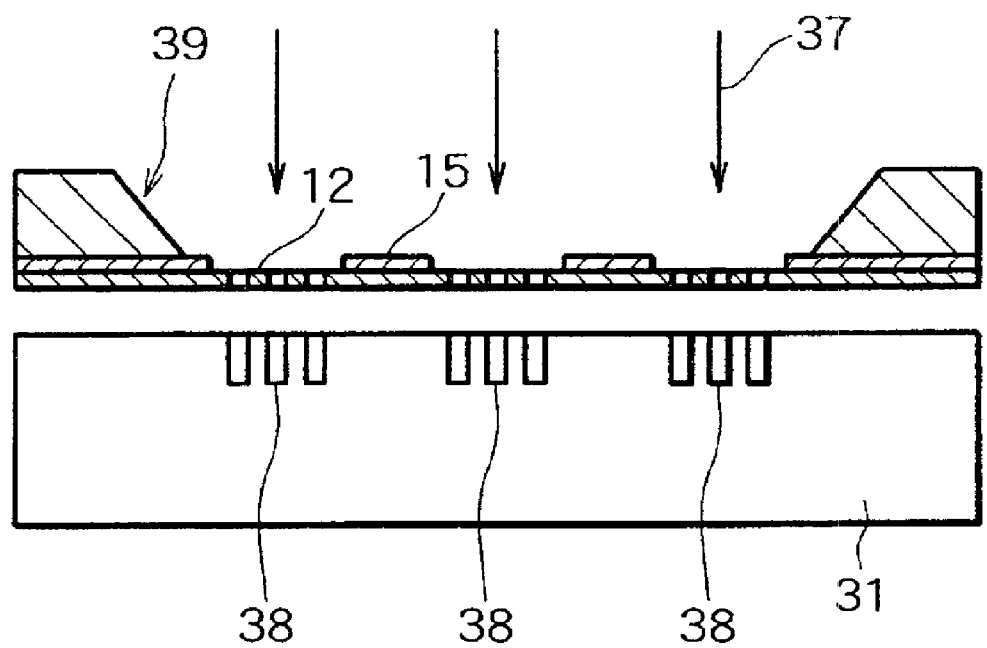

MASK FOR FABRICATION OF SEMICONDUCTOR DEVICES, PROCESS FOR PRODUCTION OF THE SAME, AND PROCESS FOR FABRICATION OF SEMICONDUCTOR DEVICES

BACKGROUND OF THE INVENTION

The present invention relates to a finely patterned mask for fabrication of semiconductor devices, a process for production of the mask, and a process for fabricating semiconductor devices with the mask.

The ever increasing degree of integration and miniaturization of LSI (large scale integrated circuit) needs a new technology for its realization, such as electron beam projection lithography (EPL), which includes PREVAIL (projection exposure with variable axis immersion lenses) and LEEPL (low energy electron beam proximity projection lithography).

PREVAIL is a so-called reduction projection exposure technique. It is designed to transfer a mask pattern to a resist layer by irradiation with a high- energy electron beam (for example, 100 keV), which has passed through a 4× stencil mask. The mask pattern is reduced to ¼ for transfer by a lens system. The mask that has been proposed for use in PREVAIL is a stencil mask which is a silicon membrane about 2 µm thick, for example, with a pattern or aperture formed therein.

The stencil mask for PREVAIL works in the following manner. The aperture forming the mask pattern permits the electron beam to pass through without scattering, and the electron beam that has passed through the aperture is focused on the resist layer, so that the mask pattern is transferred onto the resist layer. The electron beam incident on that part of the stencil mask, which has no mask pattern, is scattered by silicon atoms, and the scattered beams are screened by the limiter plate. The stencil mask is thick enough (2 µm) to cause this scattering. An excessively thin stencil mask does not function because it permits an electron beam to pass without scattering.

LEEPL is a so-called 1:1 electron beam exposure technique, which employs a 1:1 stencil mask. It is designed to transfer a 1:1 pattern to the resist layer by irradiation with a low-energy electron beam (about 2 keV). The mask that has been proposed for use in LEEPL is a stencil mask which is a silicon membrane (or thin film) or a diamond membrane, both about 500 nm thick, with a pattern or aperture formed therein. The stencil mask for LEEPL works in the following manner. That part of the mask where the aperture is formed permits the electron beam to pass through, so that the mask pattern is transferred onto the resist layer.

FIG. 12 shows a process for making a stencil mask used for conventional electron beam transfer lithography, such as LEEPL. The process starts with making a mask blank 4, which consists of a silicon substrate 1, an etching-resistant layer 2, and a membrane layer 3, as shown in FIG. 12A. The etching-resistant layer 2 functions as an etching stopper when the silicon substrate 1 undergoes selective etching. The etching-resistant layer 2 may be a silicon nitride (SiN) film if the membrane layer 3 is formed from diamond. Alternatively, the etching-resistant layer 2 may be a silicon oxide ($SiO_2$) film if the membrane layer 3 is formed from silicon (Si). In the latter case, the mask blank is a so-called SOI (silicon on insulator) substrate.

Then, the membrane layer 3 is coated with a resist and the resulting resist layer is patterned by exposure and development. Thus, there is obtained the resist mask 5, as shown in FIG. 12B. The membrane layer 3 undergoes selective etching (dry etching) through this resist mask 5. Thus, the aperture or the mask pattern 6 is formed in the membrane layer 3.

Next, the silicon substrate 1 undergoes selective etching on its reverse side, such that its peripheral part remains unetched and the part corresponding to the mask region is removed, as shown in FIG. 12C. During this selective etching, the membrane layer 3 remains intact owing to the etching-resistant layer 2.

Finally, the etching-resistant layer 2 is selectively removed by etching through the remaining part of the silicon substrate 1 as a mask, as shown in FIG. 12D. Thus, there is obtained the desired stencil mask 7.

On the other hand, there has been proposed a stepper mask for an electron beam in Japanese Patent Laid-open No. Hei 11-54409. It is constructed such that the membrane layer is divided into sections by reinforcing joists.

In the meantime, the above-mentioned stencil mask 7 has some problems to be solved. If it is to have finer patterns with higher precision, the membrane layer 3 has to be thinner than before. Unfortunately, the membrane layer 3 with a reduced thickness is so weak that the mask pattern 6 is broken when the stencil mask is cleaned or mounted on the exposure tool. Moreover, the thin membrane layer 3 with a large area distorts to adversely affect the positioning accuracy.

The membrane layer (or thin film) of the stencil mask should preferably be as thin and stiff as possible so that apertures (as fine mask patterns) can be made therein. A membrane layer, several to tens of millimeters square in area, is necessary for projection of an LSI chip pattern through a 1:1 transfer mask by scanning with an electron beam (beam of charged particles). The aperture as the mask pattern is usually formed by dry etching, and the ratio of its size to its depth is limited to about 1:10. For example, the membrane layer should be thinner than 500 nm for an aperture of 50 nm in size. For this reason, the membrane layer is formed from a material with a high Young's modulus, such as diamond, under the condition, which evolves a high tensile stress. A mask pattern (or aperture) formed in such a membrane layer distorts due to tensile stress. In addition, this tensile stress restricts the design of the wiring pattern for LSI. The wiring pattern needs a thin long "crossbar" that crosses each space between wires, and its length is limited by tensile stress.

A mask of the stepper type with a membrane layer divided into sections by reinforcing joists has the disadvantage that there occurs a seam between shots in the pattern. In addition, it is difficult to support the membrane layer with thin joists arranged at equal intervals. As a result, the membrane layer is liable to stress concentration, which not only deforms but also destroys the mask easily.

SUMMARY OF THE INVENTION

The present invention was completed in view of the foregoing. It is an object of the present invention to provide a finely patterned mask for fabrication of semiconductor devices, a process for production of the mask, and a process for fabricating semiconductor devices with the mask. The mask has high strength and high reliability even though the thickness of the membrane layer is reduced.

According to the present invention, the mask for fabrication of semiconductor devices is constructed such that the membrane layer constituting the mask has a membrane-supporting layer formed on the peripheral part of the mask pattern or the mask pattern region.

According to the present invention, the mask for fabrication of semiconductor devices is produced by a process which includes a step of preparing a mask blank consisting of a substrate, a membrane-supporting layer, and a membrane layer laid on top of the other, a step of forming apertures constituting the mask pattern in the membrane layer of the mask blank, a step of performing selective etching on the membrane-supporting layer through the membrane layer as a mask such that the peripheral part of the mask pattern or the mask pattern region remains unetched, and a step of removing by etching that part of the substrate which corresponds to the mask region.

According to the present invention, the mask for fabrication of semiconductor devices is also produced by a process which includes a step of preparing a mask blank consisting of a substrate, a first membrane-supporting layer, and a membrane layer laid on top of the other, a step of removing by etching that part of the substrate corresponding to the mask region, a step of forming by coating a second membrane-supporting layer on that side of the first membrane-supporting layer facing the removed region, a step of forming apertures constituting the mask pattern in the membrane layer, and a step of performing selective etching from the substrate side on the second and first membrane-supporting layers such that the peripheral part of the mask pattern or the mask pattern region remains unetched.

According to the present invention, the process for fabricating semiconductor devices includes performing exposure or impurity doping on wafers by using the mask for fabrication of semiconductor devices which have a membrane-supporting layer on the peripheral part of the mask pattern or the mask pattern region of the membrane layer constituting the mask.

According to the present invention, the mask for fabrication of semiconductor devices is characterized in that a membrane-supporting layer is formed on the peripheral part of the mask pattern or the mask pattern region of the membrane layer. This membrane-supporting layer reinforces the mask region and prevents the membrane layer from deformation and distortion even though the membrane layer is made thinner.

According to one process of the present invention, the mask for fabrication of semiconductor devices is produced as follows. The first step starts with preparing a mask blank consisting of a substrate, a membrane-supporting layer, and a membrane layer sequentially laid on top of the other. In the second step, the membrane undergoes patterning in conformity with a mask pattern, and then the membrane-supporting layer undergoes selective etching through the membrane layer as a mask. Etching removes that part of the membrane-supporting layer which corresponds to the mask pattern or the mask pattern region which is a collection of mask patterns, with the peripheral part of the mask pattern or the mask pattern region remaining unetched. In the final step, that part of the substrate, which corresponds to the mask region, is etched out. Thus, there is obtained the desired mask whose membrane layer hardly deforms despite its thinness.

According to another process of the present invention, the mask for fabrication of semiconductor devices is produced as follows. The first step starts with preparing a mask blank consisting of a substrate, a first membrane-supporting layer, and a membrane layer sequentially laid on top of the other. In the second step, that part of the substrate corresponding to the mask region is etched out. In the third step, that part of the first membrane-supporting layer, which corresponds to the removed part of the substrate, is coated with a second membrane-supporting layer. In this way, the membrane layer is firmly held by two membrane-supporting layers, and hence the membrane layer permits fine mask patterns to be formed therein. The first and second membrane-supporting layers undergo selective etching from the substrate side. Etching in this manner ensures high accuracy with easy control.

According to the present invention, the mask prepared as mentioned above is used for wafer exposure and impurity doping in the production of semiconductor devices. Being inflexible, the mask permits accurate exposure and doping.

BRIEF DESCRIPTION OF THE DRAWINGS

FIG. 5 is an enlarged plan view of an important part of the mask for production of semiconductor devices shown in FIG. 4;

FIG. 11 is a schematic diagram showing the process for producing a semiconductor device in another embodiment of the present invention (The mask is used for doping)

DETAILED DESCRIPTION OF THE PREFERRED EMBODIMENTS

The embodiment of the present invention will be described below with reference to the accompanying drawings.

Figure 1:
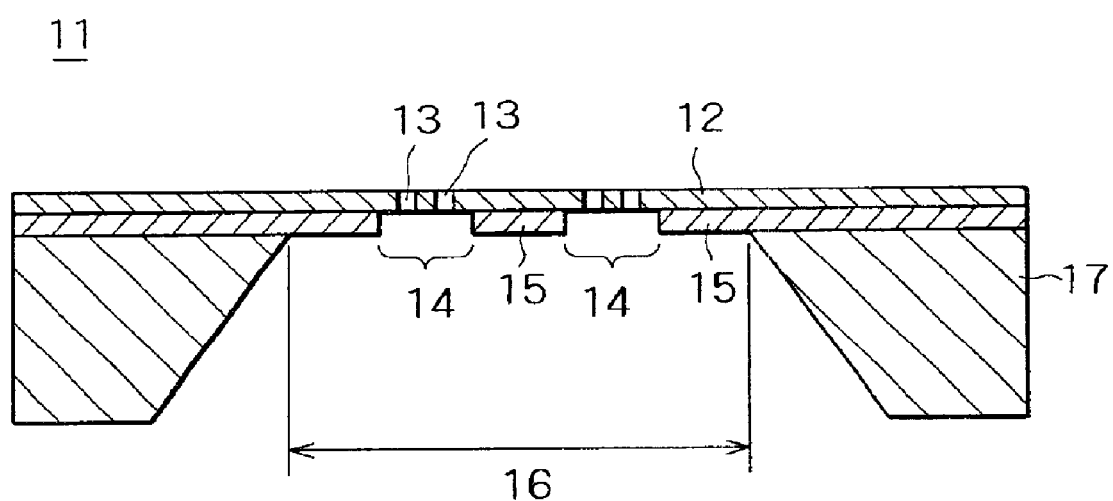
FIG. 1 is a sectional view showing the structure of the mask for production of semiconductor devices in one embodiment of the present invention.
Figure 2:
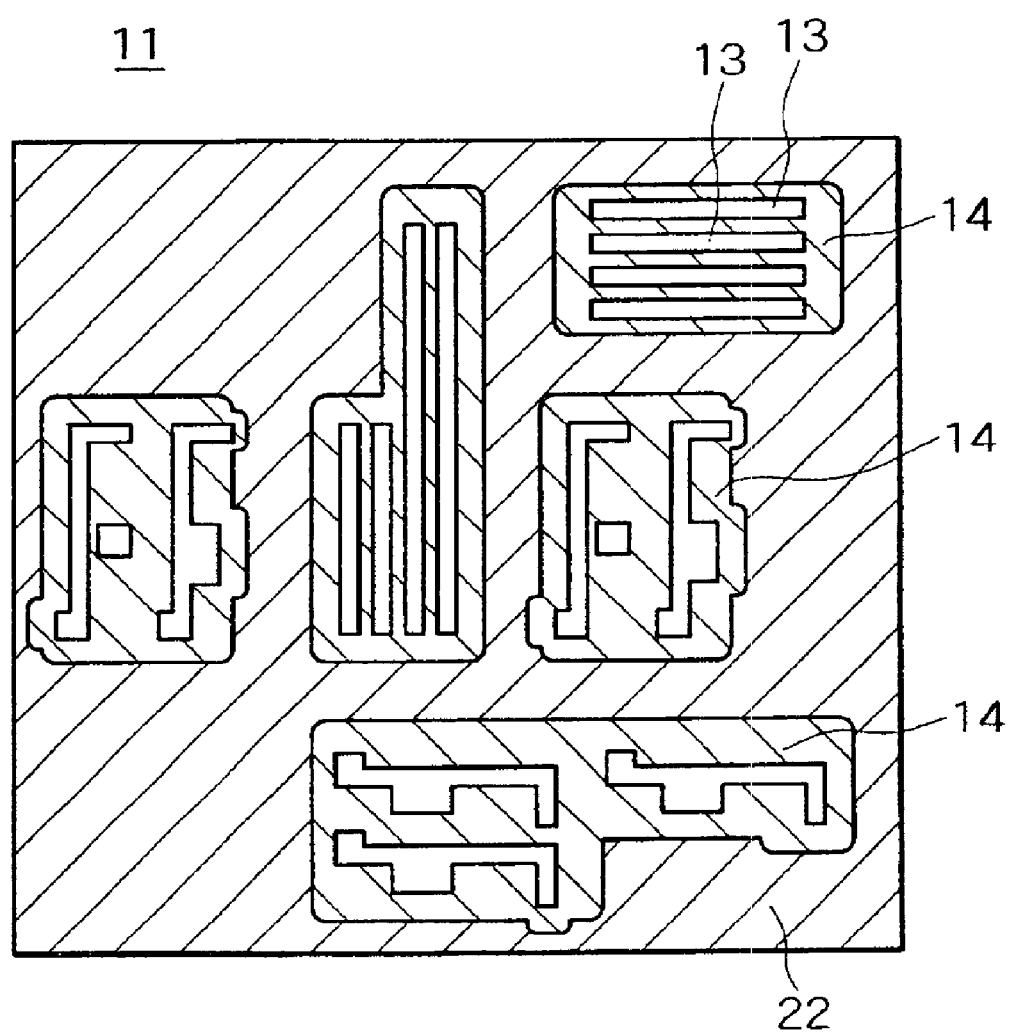
FIG. 2 is an enlarged plan view of the mask for production of semiconductor devices shown in FIG. 1.

FIG. 1 illustrates one embodiment of the present invention, which relates to the mask for fabrication of semiconductor devices. FIG. 2 is an enlarged plan view showing the important part of the mask region in which the mask pattern is formed. This embodiment is applicable to the stencil mask for lithography of electron beam transfer type.

In this embodiment, the mask for fabrication for semiconductor devices is called stencil mask 11. The stencil mask 11 consists of a membrane layer 12, a membrane-supporting layer 15, and a substrate 17. The membrane layer 12 has a mask pattern 13 (or aperture). A plurality of mask patterns form a mask pattern region 14. The membrane-supporting layer 15 is formed on the peripheral part of the mask pattern region 14. The substrate 17 is formed on the membrane-supporting layer 15 excluding the mask region 16.

The substrate 17 may be formed from silicon (Si) or any other adequate material, and it is much thicker than the membrane-supporting layer 15.

The membrane layer 12 may be formed from any of silicon nitride (SiN), silicon oxide ($SiO_2$), silicon carbide (SiC), polycrystalline diamond, diamond-like carbon (DLC), metal (such as Au, Ag, Cr, W, Pg., Pd, and Ti), TiN, TiON, silicon (Si), etc. The membrane layer 12 of Si or $SiO_2$ should preferably be coated with an antistatic film, such as SiN film and Au or Pd film. The membrane layer 12 of polycrystalline diamond or diamond-like carbon should preferably be doped with an impurity to impart electrical conductivity. A SiC layer is electrically conductive.

The membrane-supporting layer 15 may be formed from any of silicon oxide ($SiO_2$), silicon nitride (SiN), silicon (Si), polycrystalline silicon, metal (such as Au, Ag, Pg., Ti, W, Cr, and Pd), SiC, etc.

An adequate combination of the materials for the substrate 17, membrane layer 12, and membrane-supporting layer 15 will be mentioned later in the section dealing with the manufacturing process. The material for the membrane-supporting layer 15 should be one, which remains intact when the substrate 17 undergoes etching. The material for the membrane layer 12 should be one, which remains intact when the membrane-supporting layer 15 and the substrate 17 undergo etching.

The thickness of the membrane layer 12 should be about 100 to 3000 nm. To be more specific, in the case of the stencil mask for LEEPL, it should be about 100 to 1000 nm. In the case of the stencil mask for PREVAIL, it should be about 1000 to 3000 nm. Likewise, the thickness of the membrane-supporting layer 17 should be about 100 to 3000 nm. The total thickness of the membrane layer 12 and the membrane-supporting layer 17 should be larger than 500 nm, in consideration of the strength of the membrane layer 12 and the mask region 16.

The stencil mask 11 pertaining to this embodiment is thin (in the form of membrane) only in the mask pattern region 14 of the mask region 16. The non-mask pattern region 22 is backed up by the membrane-supporting layer 15 as an underlying layer. Therefore, the mask region 16 has sufficient strength even though the membrane layer 12 is thin, and, consequently, the mask region 16 is protected from distortion.

The membrane-supporting layer 15 permits the membrane to be made thin and hence permits the aperture 13 as the mask pattern to be made fine. Therefore, this embodiment provides a stencil mask that ensures reliability in the fabrication of LSIs.

FIGS. 3A to 3D illustrate one embodiment of the present invention relating to the process for producing the above-mentioned mask for fabrication of semiconductor devices. This embodiment is applicable to the production of a stencil mask for LEEPL by lithography of an electron beam transfer type.

Figure 3A:
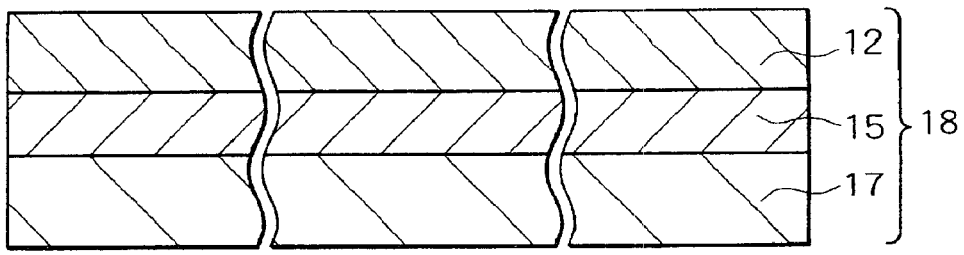
FIGS. 3A to 3D are schematic diagrams showing the process of preparing the mask for production of semiconductor devices in one embodiment of the present invention.

FIG. 3A shows the first step to prepare the mask blank 18, which consists of a substrate 17, a membrane-supporting layer 15, and a membrane layer 12 with a prescribed thickness, which are sequentially laid on top of the other. The substrate 17 may be formed from silicon (Si) or the like. The membrane-supporting layer 15 may be formed from any material, which is resistant to the etching solution used for the substrate 17. Examples of such a material include $SiO_2$, SiN, Si, polycrystalline Si, Au, Ag, Pg., Ti, W, Cr, Pd, and SiC. The membrane layer 12 may be formed from any material, which is resistant to the etching solution used for the membrane-supporting layer 15 and the substrate 17. Examples of such a material include SiN, $SiO_2$, diamond (particularly polycrystalline diamond), diamond-like carbon (DLC), SiC, Si, Au, Ag, Cr, W, Pg., Pd, and Ti.

In this embodiment, the mask blank 18 is composed of a silicon wafer with a prescribed thickness as the substrate 17, a silicon oxide ($SiO_2$) layer about 500 nm thick as the membrane-supporting layer 15, and a silicon nitride ($Si_3N_4$) layer about 500 nm thick as the membrane layer 12, which are sequentially laid on top of the other.

Figure 3B:
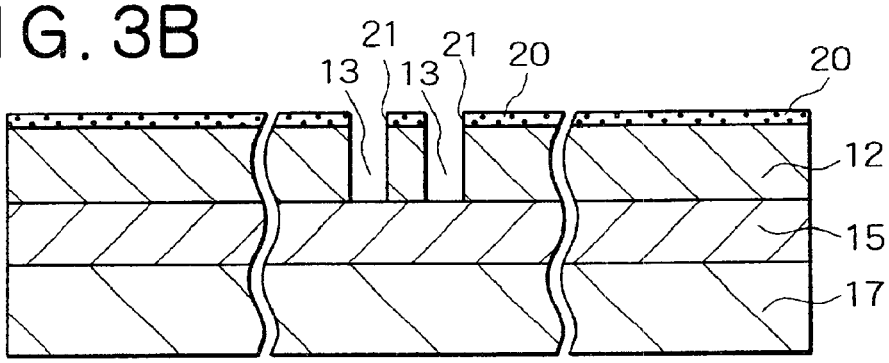

In the second step, as shown in FIG. 3B, the silicon nitride layer 12 as the membrane layer is coated with a photosensitive resist. The resist layer is exposed by an electron beam direct writing tool of variable type. After development, there is obtained the resist mask 20, which has an aperture pattern corresponding to the desired mask pattern. It is through this resist mask 20 that the silicon nitride layer 12 undergoes selective etching or dry etching with $CF_2$. This etching transfers the aperture pattern 21 in the resist layer 20 to the silicon nitride layer 12. In other words, the aperture 13 as the mask pattern is formed in the silicon nitride layer 12.

Figure 3C:
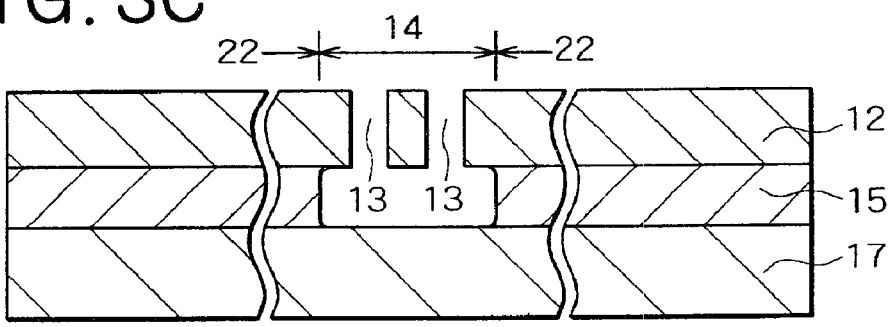

Then, as shown in FIG. 3C, the mask blank 18 is immersed in a buffered solution of hydrofluoric acid (BHF), which is an etching solution for the membrane-supporting layer 15 of silicon oxide. In this way the membrane-supporting layer 15 of silicon oxide undergoes selective etching through the membrane layer 12 of silicon nitride as the mask. The BHF solution has an etching rate of 0.5 to 1 nm/min for silicon nitride and 100 to 250 nm/min for silicon oxide. Because of this difference in etching rate, the BHF solution is capable of selective etching on the membrane-supporting layer 15 of silicon oxide. With the BHF solution supplied through the aperture 21 formed in the membrane layer 12 of silicon nitride, this selective etching takes place isotropically in such a way that a limited part of the membrane-supporting layer 15 of silicon oxide, which is slightly larger than the aperture 13 as the mask pattern, is selectively removed, with the remainder being left unetched. In this embodiment, over-etching takes place to remove that part of the membrane-supporting layer 15 of silicon oxide, which is under the mask pattern region 14 as a collection of a plurality of mask patterns 13. That part of the membrane-supporting layer 15 of silicon oxide under the peripheral part of the mask pattern region 14 or the non-mask pattern region 22 is left unetched. The remaining part of the silicon oxide layer 15 functions as the membrane-supporting layer.

Figure 3D:
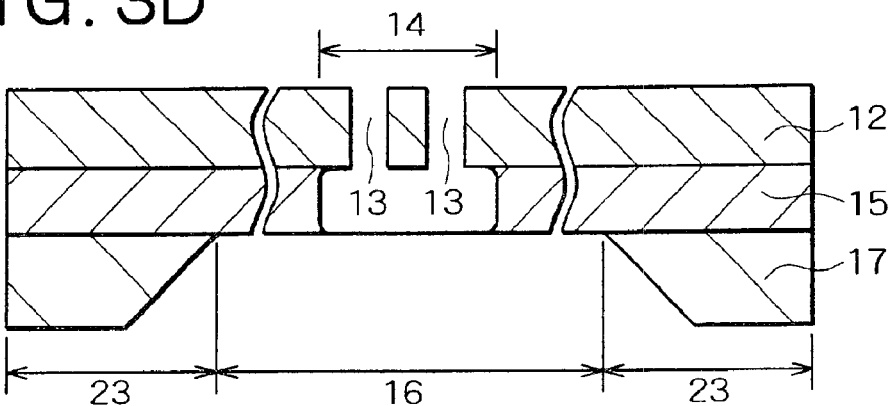

In the final step shown in FIG. 3D, that part of the silicon wafer 17 which corresponds to the mask region 16 is selectively removed. The mask region 16 is the region which is surrounded by the peripheral region 23 of the stencil mask and in which the mask pattern 13 is formed. This step is carried out in the following manner. First, the reverse side of the silicon wafer 17 is coated with a silicon oxide ($SiO_2$) film (not shown). Then, the silicon oxide film is coated with a resist film, which undergoes exposure and development, so that a resist mask is formed which has an opening corresponding to the mask region 16. Incidentally, the selective etching of the silicon oxide film to form the resist mask may be accomplished simultaneously with the selective etching of the silicon oxide film 15 as the membrane-supporting layer shown in FIG. 3C. Then, the silicon wafer 17 undergoes selective etching, which uses the silicon oxide film as a mask, such that the peripheral region 23 of the substrate 17 is left intact. This selective etching may be dry etching with a fluorine-based gas, such as $SF_6$ and $NF_3$, or wet etching with KOH or the like.

In this way there is obtained the desired stencil mask 11 for LEEPL, as shown in FIGS. 1 and 2. One or more of this stencil mask may be formed from a single silicon wafer.

Table 1 below shows the combination of materials used for the substrate 17, the membrane-supporting layer 15, and the membrane layer 12, which constitutes the mask blank 18.

TABLE 1

| Substrate | Si | Si | Si | Si |
|---|---|---|---|---|
| Membrane-supporting layer | $SiO_2$ | SiN | SiN, polycrystalline Si | $SiO_2$, SiN, Si, Au, Pt, Ti, W, Cr, Pd |
| Membrane layer | SiN | Au, Ag, Cr, W, Pt, Pd, $SiO_2$, Si, Ti, TiN, TiON | SiN, $SiO_2$ | Diamond, DLC |

The thus obtained stencil mask 11 is shown in FIG. 2 (plan view). It should be noted that only the mask pattern region 14 which is a collection of adjoining mask patterns or apertures 13 remains in the form of a membrane and the other part, that is, the non-mask pattern region 22, is backed by the underlying membrane-supporting layer 15 of silicon oxide.

The process for producing the stencil mask 11 according to this embodiment of the present invention offers the advantage of forming an extremely fine mask pattern (or aperture) 13 in the thin membrane layer 12 of silicon nitride. This advantage is achieved by dry etching on the membrane layer 12 of silicon nitride, which is the uppermost layer of the mask blank 1B consisting of the silicon wafer 17, the membrane-supporting layer 15 of silicon oxide, and the membrane layer 12 of silicon nitride.

The selective etching on the membrane-supporting layer 15 of silicon oxide leaves an unetched part which functions as the membrane-supporting layer. The membrane-supporting layer reinforces the mask pattern region 14 and hence the mask region 16 even though the membrane layer 12 is thin. This contributes to a stencil mask with high reliability.

The process according to this embodiment offers another advantage of eliminating the necessity for lithography steps to form the membrane-supporting layer 15, because it employs the membrane layer 15 of silicon nitride as a self-aligning mask. In other words, the process consists of the steps of forming the mask pattern 13 in the membrane layer 12 of silicon nitride and performing selective etching on the underlying membrane-supporting layer 15 of silicon oxide though the membrane layer 12 of silicon nitride as a mask, such that the non-mask pattern region 22 is left unetched in the membrane-supporting layer 15 of silicon oxide.

The process according to this embodiment utilizes the membrane layer 12 of silicon nitride as a mask for isotropic etching with slight over-etching on the membrane-supporting layer 15 of silicon oxide. Because of this etching, the accuracy of the mask pattern 13 is substantially controlled by the mask pattern width in the membrane layer 12. This contributes to a high-precision mask pattern 13.

In addition, the selective etching on the silicon oxide layer 15 leaves a part unetched which functions as the membrane-supporting layer. The membrane-supporting layer reinforces the mask pattern region 14 and hence the mask region 16 even though the membrane layer 12 is thin. This contributes to a stencil mask with high reliability The step shown in FIG. 3C is isotropic etching on the membrane-supporting layer 15. This isotropic etching may be either wet etching or gas etching (dry etching). Wet etching is inexpensive but has the disadvantage that the etching solution tends to stay in the aperture. Drying this residual etching solution would damage the mask pattern due to surface tension. This risk is not involved in gas etching.

The process according to the present invention uses the mask blank 18 in which the substrate 17 is a silicon wafer. Its practical advantage is that the apparatus for fabrication of semiconductor devices is also applicable to mask production.

It is desirable that the membrane layer 12 of the stencil mask 11 be given an anti-static coating in use for LEEPL (lithography of electron beam transfer type) that employs irradiation with electron beams at low accelerating voltages. If the membrane layer 12 is formed from silicon nitride, it may be coated with Au or Pt as an antistatic film by vapor deposition. If the membrane layer 12 is formed from polycrystalline diamond or diamond-like carbon (DLC), it may be rendered electrically conductive by doping with an impurity.

In use for PREVAIL with electron beams accelerated by high voltages, the stencil mask does not become charged because it scatters electron beams.

In the lithography of electron beam transfer type, the stencil mask gets hot due to irradiation with electron beams. As a result, the stencil mask expands, causing the mask pattern to dislocate. To avoid this trouble, it is desirable to form the membrane 12 from a material with good thermal conductivity. This is achieved by coating it with a metal film, which contributes to thermal conductivity as well as has an antistatic effect. Diamond has good thermal conductivity.

In the above-mentioned embodiment, the membrane-supporting layer 15 is formed in the non-mask pattern region 22 (or the peripheral part of the mask pattern region 14 in which there are adjoining mask patterns 13) of the membrane layer 12. However, the embodiment may be modified such that the membrane-supporting layer 15 is formed in the non-mask pattern part (or the peripheral part of each mask pattern 13) of the membrane layer 12.

Also, in the above-mentioned embodiment, the membrane-supporting layer 15 is formed by isotropic etching (with slight over-etching) outside the edge of the mask pattern region 14 or the mask pattern 13 in the membrane layer 12. However, the embodiment may be modified such that that part of the underlying layer corresponding to the mask pattern 13 is removed by anisotropic etching, with the remaining part of the underlying layer functioning as the membrane-supporting layer.

Figure 4:
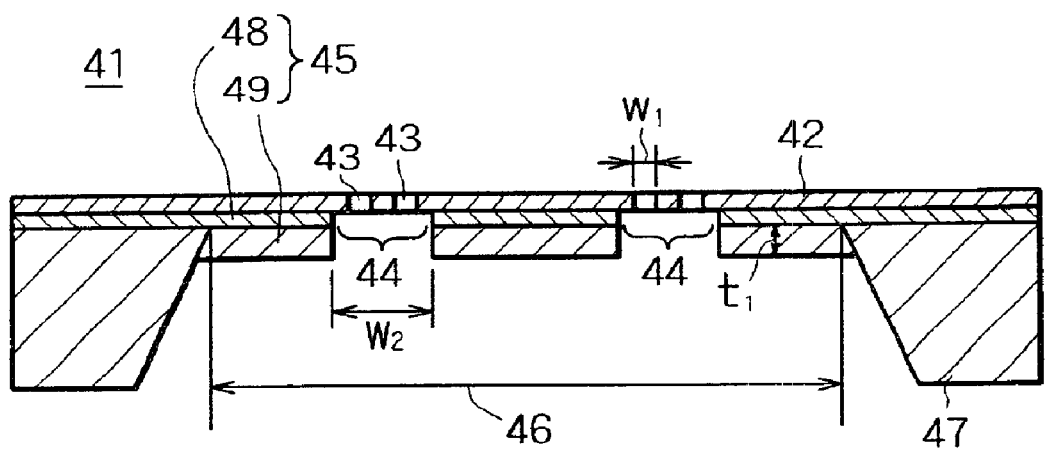
FIG. 4 is a sectional view showing the structure of the mask for production of semiconductor devices in another embodiment of the present invention.

FIG. 4 shows another embodiment of the present invention relating to the mask for fabrication of semiconductor devices. The mask has a mask region with a mask pattern formed therein, as shown in FIG. 5, which is an enlarged plan view. As in the above-mentioned embodiment, this embodiment is also applicable to the stencil mask for lithography of electron beam transfer type.

In this embodiment, the mask for fabrication of semiconductor devices is referred to as a stencil mask 41. The stencil mask 41 is composed of a membrane layer 42, a membrane-supporting layer 45 of dual layer structure, and a substrate 47. The membrane layer 42 has a mask pattern consisting of prescribed apertures. The membrane-supporting layer 45 is formed under the membrane layer 42 at the peripheral part of the mask pattern 43 or at the peripheral part of the mask pattern region 44 in which there are adjoining mask patterns. The substrate 47 is formed under the membrane-supporting layer 45 at the peripheral part excluding the mask region 46.

In this embodiment, the membrane-supporting layer 45 of dual layer structure is composed of a first membrane-supporting layer 48 and a second membrane-supporting layer 49, which are formed from different materials. The stencil mask 41 is fabricated from a mask blank consisting of a substrate 47, a first membrane-supporting layer 48, and a membrane layer 42, which becomes the mask. The second membrane-supporting layer 49 is formed afterward under the first membrane-supporting layer 48 at the part corresponding to the mask region 46.

The first membrane-supporting layer 48 should be formed from a material, which is resistant to the etchant applied to the membrane layer 42 and the substrate 47. In other words, this material should act as the etching stopper.

The mask blank consisting of a substrate 47, a first membrane-supporting layer 48, and a membrane layer 42, which are laid on top of the other, may be formed on a so-called SOI (semiconductor on insulator) substrate. An SOI substrate consists of a semiconductor substrate, an insulating layer, and a semiconductor layer, which are laid on top of the other. The substrate may be silicon, the insulating layer may be silicon oxide ($SiO_2$), and the semiconductor layer may be silicon (Si). In this case, the substrate 47 corresponds to the silicon substrate, the membrane layer 42 corresponds to the silicon layer, and the first membrane-supporting layer 48 corresponds to the silicon oxide layer. The second membrane-supporting layer 49 is formed from silicon nitride (SiN).

The mask blank could be one which consists of a silicon (Si) substrate, a first membrane-supporting layer 48 of silicon nitride (SiN), and a membrane layer 42 of silicon (Si), which are laid on top of the other. In this case, the second membrane-supporting layer 49 may be a silicon oxide ($SiO_2$) layer.

The combination of the materials for the substrate 47, the membrane layer 42, the first membrane-supporting layer 48, and the second membrane-supporting layer 49 may be the same as that used for the stencil mask 11 explained above.

The thickness of the membrane layer 42 may be approximately 100 to 3000 nm. The thickness ($t_1$) of the second membrane-supporting layer 49 may be approximately four times the width ($W_2$) of the mask pattern region 44, although it is restricted by the aspect ratio. If the thickness of the second membrane-supporting layer 49 is larger than approximately four times the width ($W_2$) of the mask pattern region 44, the second membrane-supporting layer tends to stick due to surface tension, thereby deforming the mask pattern region 44. The chip region of the stencil mask can be as large as about 50 mm×50 mm.

The stencil mask 41 according to this embodiment is characterized in that only the mask pattern region 44 in the mask region 46 remains in the form of a membrane and the other part (non-mask pattern region 52 shown in FIG. 5) is backed by the underlying first and second membrane-supporting layers 48 and 49. The membrane-supporting layers reinforce the mask region 46 even though the membrane layer 42 is made thin. Thus, the membrane layer 42 is supported uniformly without stress concentration. Therefore, the membrane and hence the mask region 46 is relieved from stress and distortion. The first and second membrane-supporting layers 48 and 49 ensure reinforcement, and this makes it possible to make the stencil mask from an SOI substrate. The SOI substrate facilitates production of the stencil mask.

In addition, the first and second membrane-supporting layers 48 and 49 provide a reinforcing structure, which realizes the thin membrane layer 42. Thus, the resulting stencil mask can have a fine transfer pattern therein.

Each mask pattern region 44 reinforced by the membrane-supporting layer(s) 45 (or 48 and 49) eliminates shot seams of the resist pattern in the lithography step.

Therefore, this embodiment provides a highly reliable stencil mask suitable for production of LSIs with fine elements in a high degree of integration.

Figure 6A:
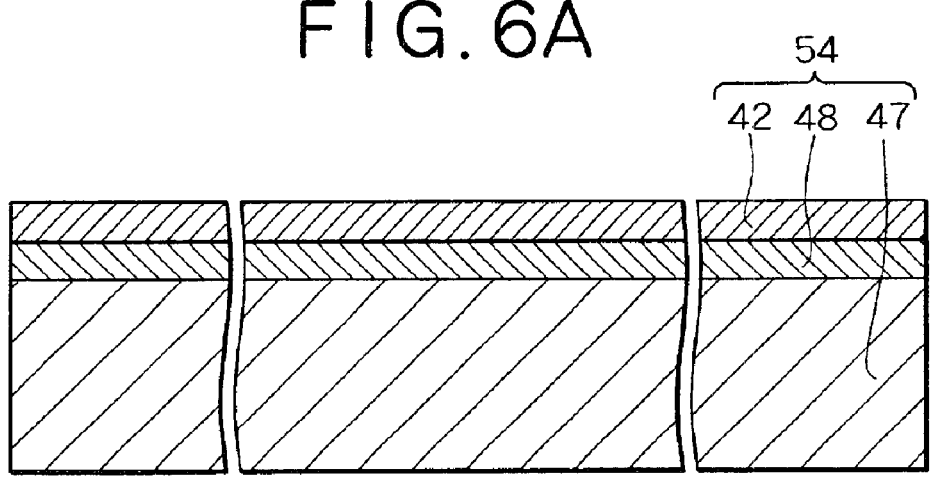
FIGS. 6A to 6C are schematic diagrams showing the process of preparing the mask for production of semiconductor devices in another embodiment of the present invention (part 1)
Figure 6B:
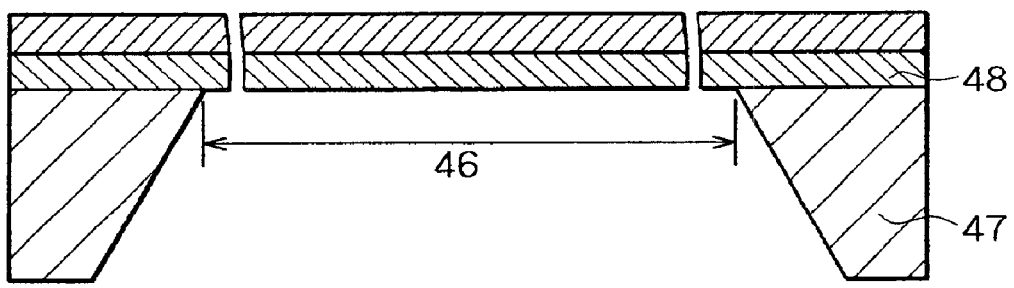
Figure 6C:
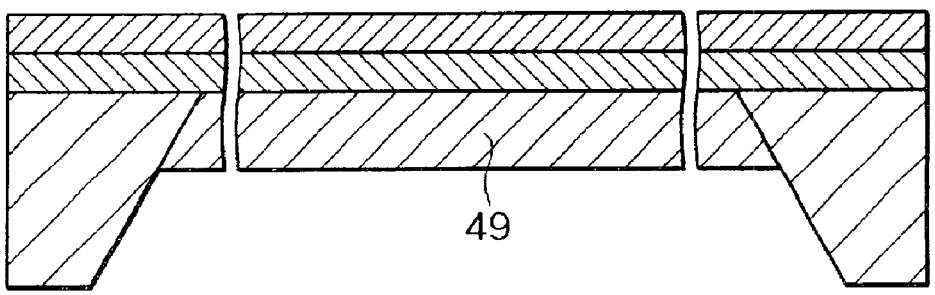
Figure 7A:
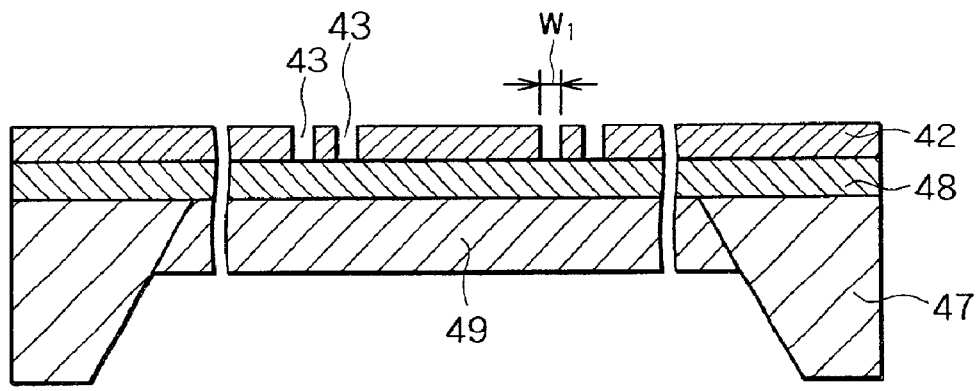
FIGS. 7A to 7C are schematic diagrams showing the process of preparing the mask for production of semiconductor devices in another embodiment of the present invention (part 2)
Figure 7B:
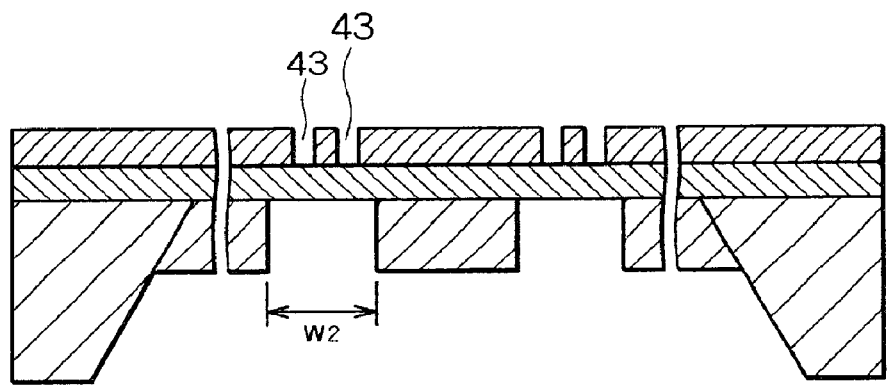
Figure 7C:
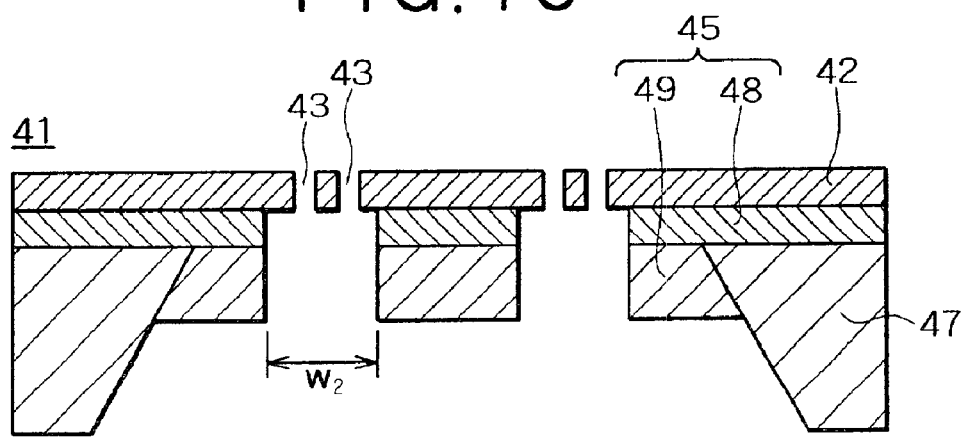

According to one embodiment of the present invention, the above-mentioned mask 41 for production of semiconductor devices is produced by the process illustrated in FIGS. 6 and 7. This mask is a stencil mask for LEEPL by lithography of electron beam transfer type.

The process uses a mask blank 54 (8-inch SOI substrate), as shown in FIG. 6A to 6C. This mask blank 54 consists of a substrate 47, a first membrane-supporting layer 48, and a membrane layer 42, which are laid on top of the other. The substrate 47 is a silicon layer about 725 $\mu$m thick. The first membrane-supporting layer 48 is a silicon oxide layer about 100 nm thick. The membrane layer 42 is a silicon layer about 100 nm thick.

The reverse side of the silicon substrate 47 of the mask blank 54 is coated with a resist layer. The resist layer is exposed through an adequate pattern. That part of the silicon substrate, which corresponds to the mask region 46, is removed by selective etching (wet etching with KOH (potassium hydroxide) aqueous solution or TMAH (tetramethylammonium hydroxide) aqueous solution). This selective etching is carried out such that the silicon substrate corresponding to the mask region 46 is removed except for that part which corresponds to the peripheral part of the mask region 46.

In the third step, the reverse side of the silicon oxide layer 48 from which the silicon substrate 47 has been selectively removed is coated with a silicon nitride layer 49 (about 10 $\mu$m thick) by CVD (chemical vapor deposition), sputtering, or the like, as shown in FIG. 6C. This silicon nitride layer 49 functions as the second membrane-supporting layer.

The thickness of the silicon nitride layer 49 should be 10 to 20 $\mu$m if the chip region is 25 mm square, as mentioned above. This thickness is restricted by the aspect ratio. The maximum thickness should be approximately four times the width ($W_2$) of the mask pattern region 46.

In the fourth step, the surface of the silicon layer 42 as the membrane layer is coated with a photosensitive resist layer. The resist layer is exposed by an electron beam direct writing tool of variable type. After development, there is obtained the resist mask (not shown) which has an aperture pattern corresponding to the desired mask pattern. Through this resist mask, the silicon layer 42 as the membrane layer undergoes selective etching or dry etching with $SF_6$, HBr, $Cl_2$, or the like, so that the open pattern in the resist mask is transferred to the silicon layer 42, as shown in FIG. 7A. In this way, the aperture 43 with a small width $W_1$ as the mask pattern is formed in the silicon layer 42.

In the fifth step, the reverse side of the silicon nitride layer 49 as the second membrane-supporting layer is coated with a photoresist layer (not shown). The photoresist layer is exposed and developed to form a resist mask having an opening corresponding to the mask pattern region. Through this resist mask, the silicon nitride layer 49 undergoes selective etching or dry etching with $CF_4$ or the like, as shown in FIG. 7B. In this way, the second membrane-supporting layer 49 is formed.

In the final step, the silicon oxide layer 48 is etched from its reverse side by using the second membrane-supporting layer 49 as a mask. This etching is dry etching with $CF_4$, $CHF_3$, $C_4F_9$, or the like. In this way, the first membrane-supporting layer 48 is formed. The first and second membrane-supporting layers 48 and 49 constitute the membrane-supporting layer 45. Thus, there is obtained the desired stencil mask 41 for LEEPL.

The thus obtained stencil mask 41 is shown in FIG. 5, which is a plan view. It should be noted that only the mask pattern region 44 which is a collection of adjoining mask patterns or apertures 43 remains in the form of a membrane and the other part, that is, non-mask pattern region 52, is backed by the underlying membrane-supporting layer 45 consisting of the silicon oxide layer 48 and the silicon nitride layer 49.

In the step shown in FIG. 7B, the photosensitive resist layer is exposed according to a prescribed pattern. This exposure is accomplished by using an electron beam direct write tool of variable type, as explained in the following.

Figure 8A:
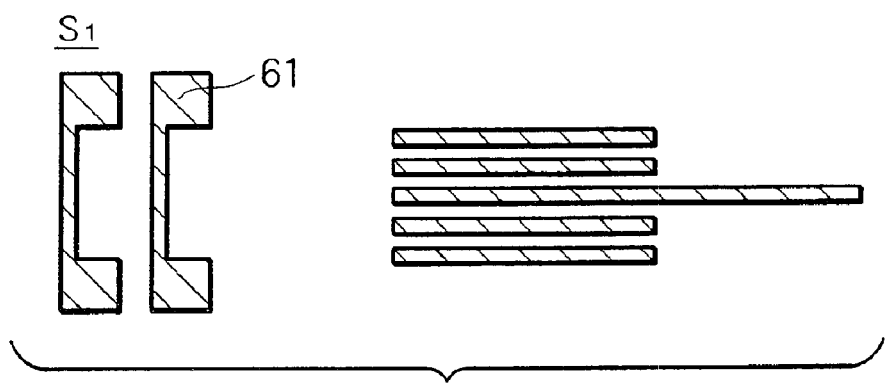
FIGS. 8A to 8C are diagrams illustrating the procedure for making an exposure pattern (part 1)
Figure 8B:
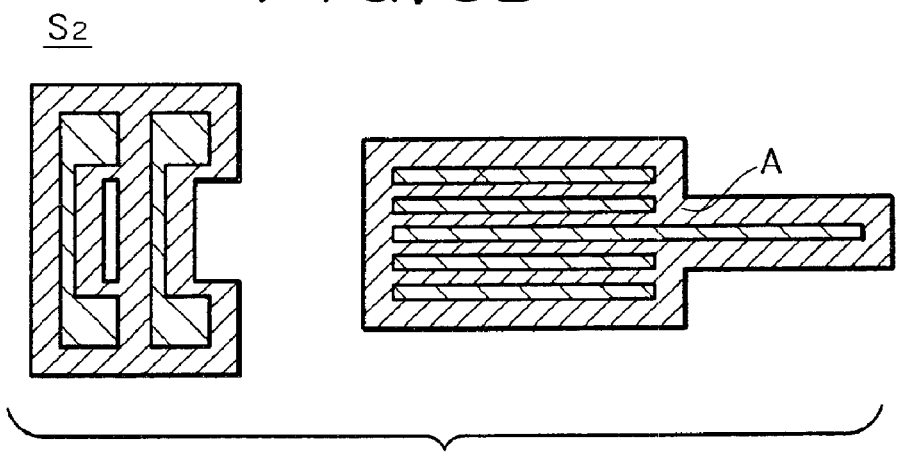
Figure 8C:
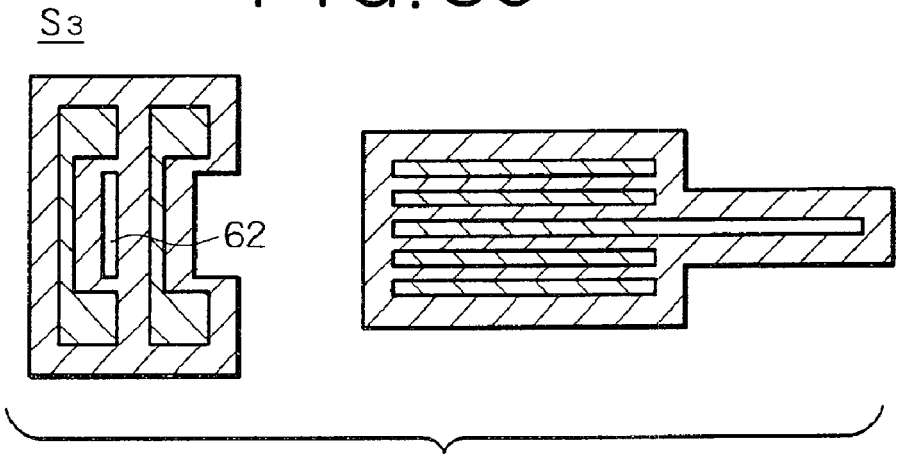
Figure 9A:
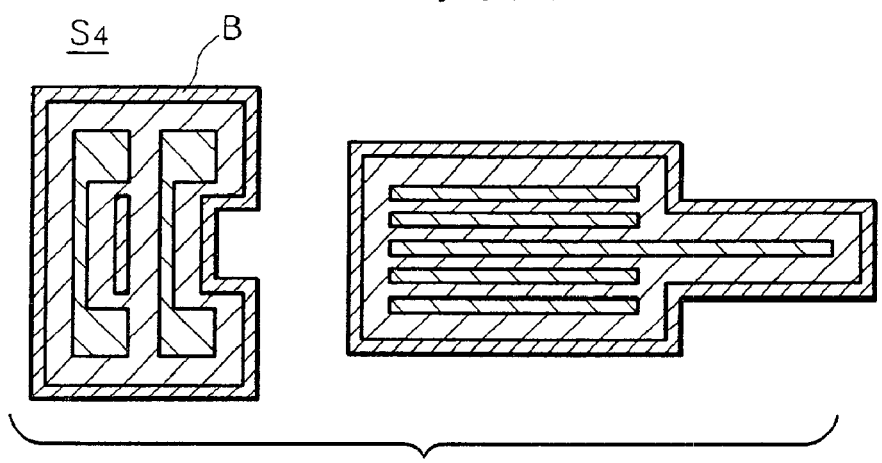
FIGS. 9A to 9C are diagrams illustrating the procedure for making an exposure pattern (part 2)
Figure 9B:
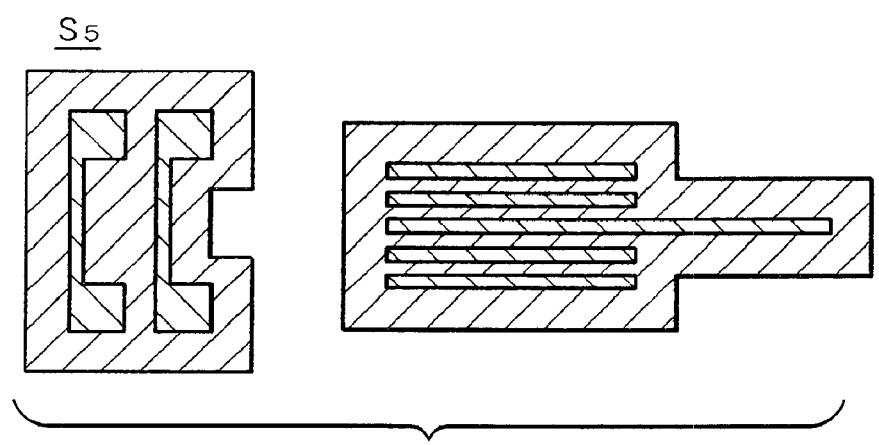
Figure 9C:
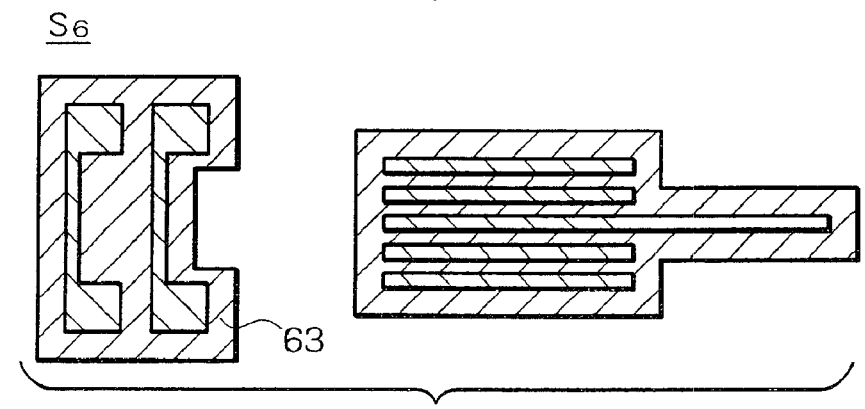

The first step $S_1$, shown in FIG. 8A, acquires the mask pattern data 61. The second step $S_2$, shown in FIG. 8B, enlarges the mask pattern data 61 by a certain amount A. The third step S3, shown in FIG. 8C, performs addition (OR operation) on the patterns. The fourth step S4, shown in FIG. 9A, enlarges the pattern again by a certain amount B. The fifth step $S_5$, shown in FIG. 9B, again performs addition (OR operation) on the patterns. The sixth step $S_6$, shown in FIG. 9C, reduces the pattern by the same amount as B. In this way, there is obtained a one-pass pattern region 63, which serves as the mask pattern region.

According to this embodiment, the stencil mask 41 is produced from an SOI substrate as the mask blank 54. The process consists of dry etching for patterning the surface of the silicon layer 42, thereby forming a mask pattern (or aperture), and forming the silicon nitride layer 49 such that the silicon oxide layer 48 of the SOI substrate and the added silicon nitride layer 49 constitute the membrane-supporting layer 45 composed of the first and second membrane-supporting layers. This procedure makes it possible to reduce the thickness of the membrane layer 42 and to form an extremely fine mask pattern 43.

Moreover, the process according to this embodiment includes the steps of performing etching on the reverse side of the silicon substrate 47, thereby removing a large part except for the peripheral part of the mask region 46, forming the silicon nitride layer 49 with a prescribed thickness on the reverse side of the silicon oxide layer 48 that has been exposed by etching, and performing selective etching on the silicon nitride layer 49 and the silicon oxide layer 48. The unetched parts of the silicon nitride layer 49 and the silicon oxide layer 48 function as the membrane-supporting layer 45. Therefore, the mask pattern region 44 has improved strength even though the membrane layer 42 is thin. The membrane layer 42 is supported uniformly without stress concentration, and the resulting stencil mask is free of stress and distortion and has high reliability.

The selective etching that is performed on the reverse side of the silicon nitride layer 49 and the silicon oxide layer 48 to form the first membrane-supporting layer 48 and the second membrane-supporting layer is easy to control and helps form the membrane-supporting layer accurately. The easily controlled etching in combination with the use of a SOI substrate facilitate production of a high-precision stencil mask.

In the above-mentioned embodiment, the process of the present invention is applied to the production of a stencil mask for LEEPL with lithography of electron beam transfer type. However, it also can be applied to production of a stencil mask for PREVAIL with lithography of electron beam transfer type, a stencil mask for an electron beam direct write tool of variable type, and a stencil mask for ion beam lithography, so-called lithography of charged particle transfer type.

In addition, the mask for fabrication of semiconductor devices produced according to the present invention also can be used as a mask for exposure and impurity doping (e.g., ion implantation) in the production of semiconductor devices.

Figure 10A:
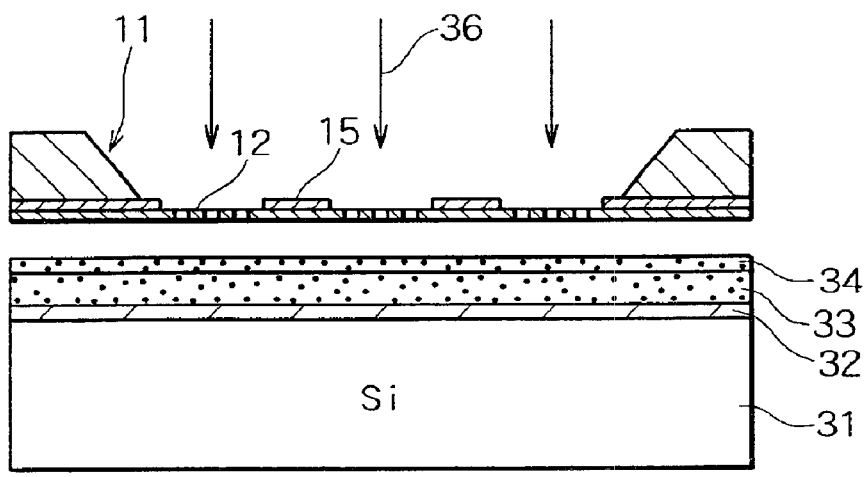
FIGS. 10A to 10C are schematic diagrams showing the process for producing a semiconductor device in one embodiment of the present invention (The mask is used for exposure)
Figure 10B:
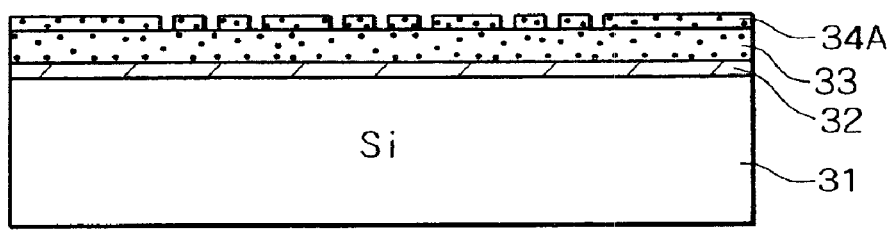
Figure 10C:
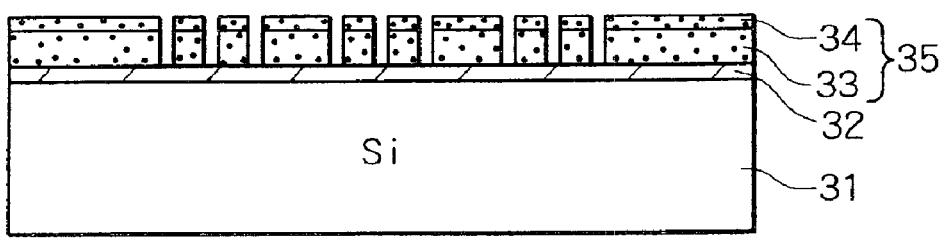
Figure 12A:
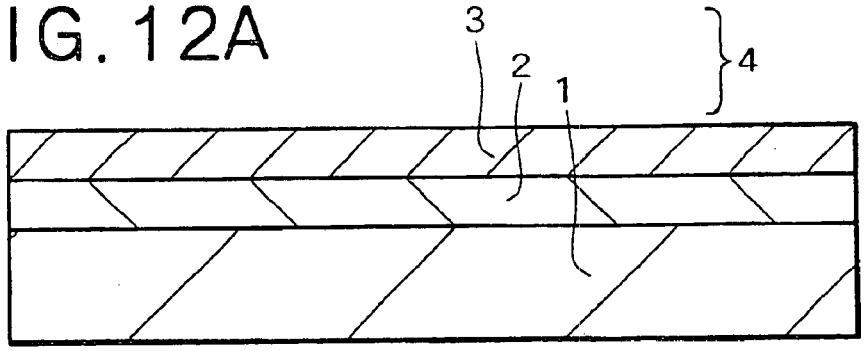
FIGS. 12A to 12D are diagrams showing the steps of making a stencil mask for LEEPL by conventional electron beam transfer lithography.
Figure 12B:
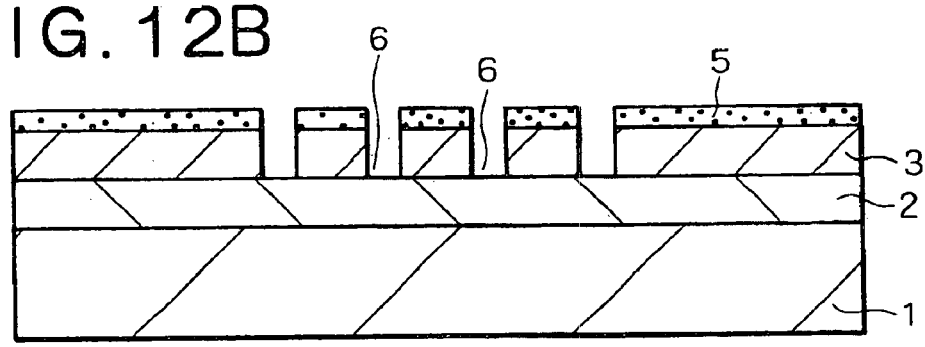
Figure 12C:
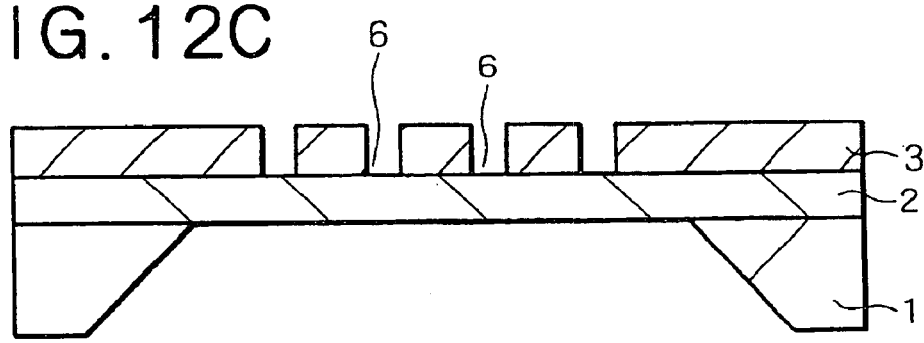
Figure 12D:
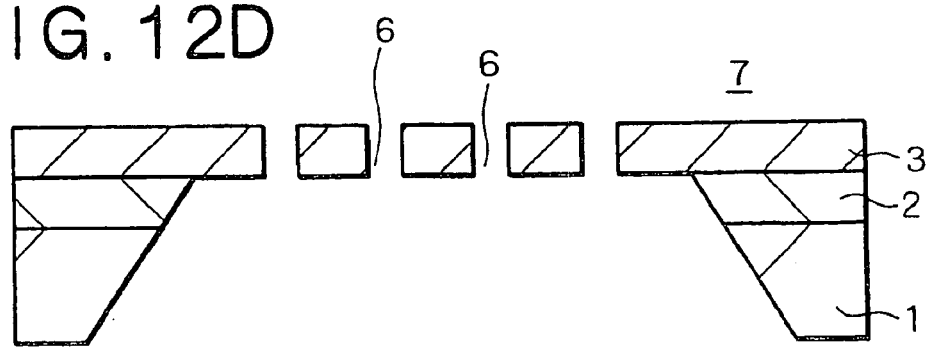

FIG. 10 shows one embodiment covering the process for fabricating semiconductor devices. According to this embodiment, the mask for fabrication of semiconductor devices shown in FIG. 1 is applied to exposure to form a resist mask on a semiconductor wafer.

The process in this embodiment starts with coating a semiconductor wafer or a silicon wafer 31 with a non-photosensitive resist layer 33 directly or with an $SiO_2$ insulating film 32 interposed between them and a photosensitive resist layer 34 (not thicker than 100 nm) for electron beams, as shown in FIG. 10A. Then, this silicon wafer 31 is placed in an electron beam exposure apparatus such that it faces the stencil mask 11 of the present invention shown in FIG. 1. The stencil mask 11 is positioned such that the membrane part 12 is a prescribed distance (for example, 40 μm) away from the resist layer 34 of the silicon wafer 31. Irradiation with electron beams is carried out so that the photosensitive resist layer 34 is exposed through a desired pattern. After development, there is obtained a resist mask 34A, as shown in FIG. 4B.

This resist mask 34A is used for dry etching to selectively remove the underlying non-photosensitive resist layer 33. Thus, there is formed a resist mask 35 consisting of two resist layers 33 and 34.

According to this embodiment, exposure is carried out by using the stencil mask 11 constructed such that the reverse side of the membrane layer 12 is reinforced with the membrane-supporting layer 15 and has the fine mask pattern 13. Therefore, exposure in this manner forms the resist mask 35 with a fine pattern free of pattern displacement on the semiconductor wafer 31 and with the insulating film 32 interposed between them. This resist mask 35 is used for subsequent selective etching and impurity doping. In this way, it is possible to produce LSIs with fine elements in a high degree of integration.

In the case where exposure is carried out by using an exposure apparatus of PREVAIL type, the same stencil mask as shown in FIG. 1, except that the membrane is thicker than 1000 nm, may be used. In this case, the silicon wafer 31 is coated with a photosensitive resist layer directly or with an $SiO_2$ insulating film interposed between them. The coated wafer is placed in an electron beam exposure apparatus of PREVAIL type. The mask pattern in the stencil mask is transferred by electron beam exposure and ensuing development. In this way, there is obtained the desired resist mask. The subsequent steps are the same as those mentioned above.

FIG. 11 shows another embodiment covering the process for fabricating semiconductor devices. According to this embodiment, the above-mentioned mask for fabrication of semiconductor devices is applied to impurity doping into a semiconductor wafer.

According to this embodiment, a semiconductor substrate or a silicon wafer 31 is placed in an impurity ion implantation apparatus. On one side of the wafer 31 is laid the mask 39 for ion implantation, which has the same construction as shown in FIG. 1. The mask 39 permits impurity ions 37 to be implanted into the silicon wafer 31 there through. This ion implantation forms the impurity doped region 38 in the silicon wafer 31.

According to this embodiment, impurity doping is carried out by using the mask. 39 constructed such that the reverse side of the membrane layer 12 is reinforced with the membrane-supporting layer 15 and has the fine mask pattern 13. Therefore, direct ion implantation into the silicon wafer 31 permits accurate doping in the fine pattern region. Thus, it is possible to form the fine doped region 38. In this way, it is possible to produce LSIs with fine elements in a high degree of integration.

In addition, the mask 41 for fabrication of semiconductor devices, as shown in FIG. 4, may be used for exposure or impurity doping in the same way as shown in FIGS. 10 and 11. In this case, it too, is possible to obtain the same effect as obtained with the mask 11 for fabrication of semiconductor devices as shown in FIG. 1. In this way, it is possible to produce LSIs with fine elements in a high degree of integration.

According to the present invention, the mask for fabrication of semiconductor devices has the membrane-supporting layer in the peripheral part of the mask pattern or the mask pattern region in the membrane layer constituting the mask. This membrane-supporting layer protects the membrane layer from stress and distortion.

The increased strength due to the membrane-supporting layer permits the membrane layer to be made thinner and the aperture as the mask pattern to be made finer. This leads to a mask suitable for production of LSIs with fine elements in a high degree of integration.

If the membrane-supporting layer is formed outside the edge of the mask pattern or the mask pattern region, the substantial mask pattern width in the membrane layer is restricted. This leads to a mask suitable for production of LSIs with fine elements in a high degree of integration.

If the membrane-supporting layer is of multiple-layer structure, it is possible to ensure mask reinforcement, thereby protecting the membrane layer from stress and distortion, and hence it is possible to make the membrane layer thinner and the mask pattern finer.

According to the present invention, the process for production of the mask for fabrication of semiconductor devices uses the mask blank 18 having a membrane layer and a membrane-supporting layer on one side of a substrate. The process forms apertures as the mask pattern in the membrane layer. In this way, it is possible to make the membrane layer thinner and the mask pattern finer. In addition, the process includes the steps of forming the mask pattern in the membrane layer and performing selective etching on the membrane layer such that the peripheral part of the mask pattern or the mask pattern region is left unetched. In this way, it is possible to form the membrane layer free of stress and distortion. In addition, it is possible to form the membrane-supporting layer by self-alignment. In other words, it is possible to eliminate the lithography step to form the membrane-supporting layer.

If the underlying membrane-supporting layer is selectively removed by isotropic etching through the membrane layer as a mask, the substantial mask pattern width in the membrane layer is restricted. This leads to a high-precision mask pattern.

According to the present invention, another process for production of the mask for fabrication of semiconductor devices uses a mask blank having a first membrane-supporting layer which functions also as an etch stopper and a membrane layer on one side of a substrate. The process consists of etching that part of the substrate which corresponds to the mask region and coating the exposed part of the first membrane-supporting with a second membrane-supporting layer such that the membrane-supporting layer is formed from the first and second membrane-supporting layers. This structure contributes to mask reinforcement, and hence it is possible to make the membrane layer 42 thinner and to make the mask pattern finer. The membrane-supporting layer of dual-layer structure uniformly supports the membrane layer 42. This leads to a stencil mask with high reliability free of stress and distortion.

The first and second membrane-supporting layers receive etching for patterning on their reverse side. Etching in this manner facilitates the control of selective etching and permits the membrane-supporting layer to be formed accurately. In addition, the use of an SOI substrate facilitates etching control. Thus, it is possible to produce the mask for fabrication of semiconductor devices easily and accurately.

According to the present invention, the process for fabrication of semiconductor devices employs for exposure the above-mentioned mask for fabrication of semiconductor devices. Exposure in this manner gives a resist mask with a fine mask pattern free of pattern displacement. This resist mask can be used for selective etching and impurity implantation. Thus, it is possible to produce LSIs with fine elements in a high degree of integration.

According to the present invention, the process for fabrication of semiconductor devices employs for impurity doping the above-mentioned mask for fabrication of semiconductor devices. Doping in this manner permits accurate doping in the fine pattern region. Thus, it is possible to produce LSIs with fine elements in a high degree of integration.

According to the present invention, it is possible to eliminate shot seams of the resist pattern because the membrane-supporting layer is formed for each mask pattern region.

While the preferred embodiments of the present invention have been described using specific terms, such description is for illustrative purposes only, and it is to be understood that changes and variations may be made without departing from the spirit or scope of the following claims.

What is claimed is:

1. A mask for fabrication of semiconductor devices which comprises a membrane-supporting layer which is formed outside edges of mask pattern regions or mask patterns in a membrane layer constituting the mask, wherein a non-mask pattern region is left unetched in the membrane-supporting layer and only the membrane-supporting layer in the mask pattern region is etched, and wherein the membrane-supporting layer is exposed in lithography.

2. The mask for fabrication of semiconductor devices as defined in claim 1, wherein said membrane-supporting layer is of a dual-layer structure.

3. The mask for fabrication of semiconductor devices as set forth in claim 1, wherein a thickness of a second membrane-supporting layer is larger than approximately four times a width (W2) of the mask pattern region.

4. A process for producing a mask for fabrication of semiconductor devices, comprising the steps of:
preparing a mask blank consisting of a substrate, a membrane-supporting layer, and a membrane layer laid on top of each other;
forming apertures constituting the mask pattern in said membrane layer;
performing selective etching on said membrane-supporting layer through said membrane layer as a mask such that the membrane-supporting layer is formed outside edges of the mask pattern regions or mask patterns in the membrane layer, a non-mask pattern region remains unetched in the membrane-supporting layer, and only the membrane-supporting layer in the mask pattern regions is etched; and
removing by etching that part of said substrate which corresponds to the mask region.

5. The process for producing a mask for fabrication of semiconductor devices as defined in claim 4, wherein said membrane-supporting layer is removed by isotropic etching.

6. A process for producing a mask for fabrication of semiconductor devices, comprising the steps of:
preparing a mask blank consisting of a substrate, a first membrane-supporting layer which functions also as an etching stopper, and a membrane layer laid on top of each other;
removing by etching that part of the substrate which corresponds to the mask region;
forming by coating a second membrane-supporting layer on that side of the first membrane-supporting layer facing the removed region;
forming apertures as mask pattern in the membrane layer; and
performing selective etching on the second and first membrane-supporting layers such that the peripheral part of the mask pattern or the mask pattern region remains unetched.

7. The process for producing a mask for fabrication of semiconductor devices as set forth in claim 4, wherein a thickness of a second membrane-supporting layer is larger than approximately four times a width (W2) of the mask pattern region.

8. A process for fabricating semiconductor devices which comprises performing exposure on the wafer by using the mask for fabrication of semiconductor devices which comprises a membrane-supporting layer formed outside edges of the mask pattern regions or mask patterns in the membrane layer constituting the mask, and a non-mask pattern region remains unetched in the membrane-supporting layer, wherein only the membrane-supporting layer in the mask pattern region is etched.

9. A process for fabricating semiconductor devices as defined in claim 8, which comprises performing impurity doping on the wafer by using the mask for fabrication of semiconductor devices which has a membrane-supporting layer on the peripheral part of the mask pattern or the mask pattern region in the membrane layer constituting the mask.

10. The process for producing a mask for fabrication of semiconductor devices as set forth in claim 8, wherein a thickness of a second membrane-supporting layer is larger than approximately four times a width (W2) of the mask pattern region.

11. A method for acquiring non-mask pattern region data comprising the steps of:
acquiring mask pattern data;
enlarging the mask pattern data by a certain amount;
performing OR operation on the mask patterns; and
reducing the pattern by the same amount.

12. The method for acquiring a non-mask pattern as set forth in claim 11, wherein a thickness of a second membrane-supporting layer is larger than approximately four times a width (W2) of the mask pattern region.

* * * * *